United States Patent [19]

Chang

[11] 4,434,403
[45] Feb. 28, 1984

[54] UNIVERSAL RESET CIRCUIT FOR DIGITAL CIRCUITRY

[75] Inventor: Gerald W. Chang, San Pedro, Dominican Republic

[73] Assignee: Burroughs Corporation, Detroit, Mich.

[21] Appl. No.: 295,423

[22] Filed: Aug. 24, 1981

[51] Int. Cl.³ .................. H03K 5/24; H03K 5/153
[52] U.S. Cl. .................. 328/120; 307/234; 307/350; 307/363; 307/518; 307/296 R
[58] Field of Search .............. 307/350, 354, 362, 363, 307/296 R, 296 A, 592, 608, 234, 518; 328/120, 150; 365/226, 228

[56] References Cited

U.S. PATENT DOCUMENTS 4,230,958 10/1980 Boll et al. ........................... 328/120
4,266,145 5/1981 Amacher et al. ............... 307/296 R
4,367,422 1/1983 Leslie .................................. 307/592
4,367,423 1/1983 Hornung ............................. 307/350

*Primary Examiner*—John Zazworsky
*Attorney, Agent, or Firm*—David G. Rasmussen; Kevin R. Peterson; David G. Rasmussen

[57] ABSTRACT

The invention is a universal reset circuit for digital circuitry which monitors both clock pulses and DC voltage and provides a reset command when detecting a low DC voltage or missing clock pulse. The device uses two comparators and an RC circuit to form a pulse timing circuit which monitors clock pulses. Low DC voltage is monitored by a bridge circuit and a reference voltage. A third comparator receives signals from both the pulse timing circuit at the bridge circuit and produces a reset command. The reset command could re-initialize a microprocessor chip or the input controller of a main computer system.

10 Claims, 2 Drawing Figures

UNIVERSAL RESET CIRCUIT FOR DIGITAL CIRCUITRY

BACKGROUND OF THE INVENTION

1. Field of the Invention

This invention is a universal reset circuit for digital circuitry which monitors both clock pulses and DC voltage and provides a reset command when detecting a low DC voltage or a missing clock pulse.

2. Description of the Prior Art

With the increased frequency of power brownouts and power interruptions, it is necessary to have a reliable circuit which can detect both a low DC voltage and a missing clock pulse and generate a reset command. The reset command would re-initialize a microprocessor chip or the input controller of a main computer system. Without such a reset circuit a brownout or power interruption in a peripheral device would necessitate an operator shutdown of the entire computer system.

Power brownouts and power interruptions can be of two types. They can be of a relatively long duration and produce a lowering of the DC voltage, or of a transient nature, resulting in a possible missed pulse in the clock circuit. A missed pulse in the clock circuit could also be produced by an EMI signal or by an electrostatic discharge. It is desirable to detect both a reduced DC voltage and a missed clock pulse.

Prior art devices fail to detect both a low DC voltage and a missed clock pulse. Some prior art devices concentrate on clock pulse failure and detection using complex multi-vibrator circuits or continuously comparing one clock with another clock in phase lock. Other prior art devices concentrate on protecting volatile memory from DC power interruptions. The prior art does not show a circuit which can detect both low DC voltage and a missed clock pulse and generate a reset pulse which is compatible with current microprocessor chips and input controllers.

SUMMARY OF THE INVENTION

The present invention recognized the need for a universal reset circuit and provides a circuit which can be fabricated from a single integrated circuit chip. The circuit monitors both DC voltage and clock pulses and generates a reset command when low DC voltage is detected or when a clock pulse is missing.

The invented device uses two comparators and an RC circuit to form a pulse timing circuit. The pulse timing circuit monitors clock pulses and generates a negative pulse when a clock pulse does not appear within a certain time period. A divider circuit, connected across the DC voltage, provides a test voltage which is set less than the reference voltage when a low DC voltage is experienced. A 1% Zener diode, or equivalent reference voltage device, provides the stable reference voltage. A third comparator receives as one input a combined signal from the divider circuit and the pulse timing circuit, and compares the resulting voltage with the reference voltage. When a negative pulse is produced by comparator 38, a low output reset signal will be produced by comparator 22. An RC delay circuit connects to the comparator and will delay the low DC voltage reset signal to allow for transients in the power supply to settle.

A novel feature of this invention is to combine DC low voltage detection and clock pulse failure detection in the same circuit. Since both functions are included in the same circuit there is a reduction in the number and complexity of components. In addition, this feature enables the claimed invention to detect both a long and a short interval power interruption.

A novel feature of the invention is to provide both a missing pulse reset command and a low DC voltage reset command on the same output signal. This output reset command is made compatible with the reset pin on microprocessors and input controllers for computer systems.

Another novel feature of the invention is the use of two comparators and an RC circuit to detect a missing clock pulse. This feature allows the circuit to be built with reduced components and lowers the expense of manufacturing.

Another novel feature of the invention is the use of reduced components which allows the entire universal reset circuit to be fabricated on a single integrated circuit chip.

DETAILED DESCRIPTION OF THE PREFERRED EMBODIMENT

Figure 1:
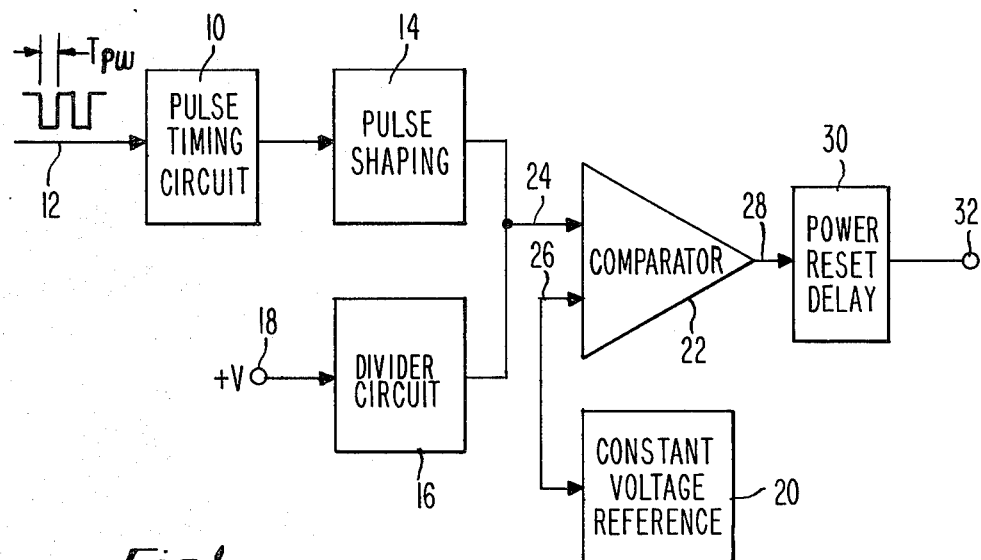
FIG. 1 is a functional blocked diagram of the universal reset circuit.

A function block diagram of the universal reset circuit is shown in FIG. 1. The invented circuit is generally composed of the following: a pulse timing circuit 10 which monitors clock pulses and will generate a negative reset pulse when the clock pulse misses a beat, a pulse shaping circuit 14 which shapes the reset pulse generated by the pulse timing circuit 10, a divider circuit 16 connected to the DC voltage 18 which produces a test voltage which will be less than a reference voltage when the DC voltage drops below a certain value, a constant voltage source 20 which produces a stable reference voltage, a comparator 22 which compares one input 24, the sum of the outputs from the divider circuit 16 and the pulse shaping circuit 14, with the other input 26, connected to the constant voltage source 20.

In operation, a drop in the DC voltage 18 below a certain value will cause the divider circuit 16 to provide a voltage to the input 24 of the comparator 22 which is below the reference voltage 20. The output of the comparator 28 will then swing from its normal high output to a low output. The low output will be produced as long as the DC voltage 18 remains low. When the DC voltage 18 returns to an appropriate level, the comparator's output 28 will be driven high. A power reset delay circuit 30 is connected to the output 28 of the comparator and will hold the output 32 low for a set period of time after the DC voltage level has returned to normal. This feature allows sufficient time for transients to settle before the reset signal is sent.

The pulse timing circuit 10 monitors the system clock pulse 12 and if a clock pulse is not presented within a set period of time, the pulse timing circuit 10 generates a negative pulse. The shape of this pulse is controlled by a pulse shaping circuit 14 so the reset pulse is compatible with the microprocessor chip or the input controller. A negative reset pulse applied to terminal 24 of comparator 22 will produce a negative pulse at the output 28 of the comparator, and will be sent to the microprocessor or input controller by output 32.

The reset command output 32 for both low DC voltage and a missing clock pulse may be connected to a reset pin commonly found on microprocessor chips and to an input controller of the computer system.

Figure 2:
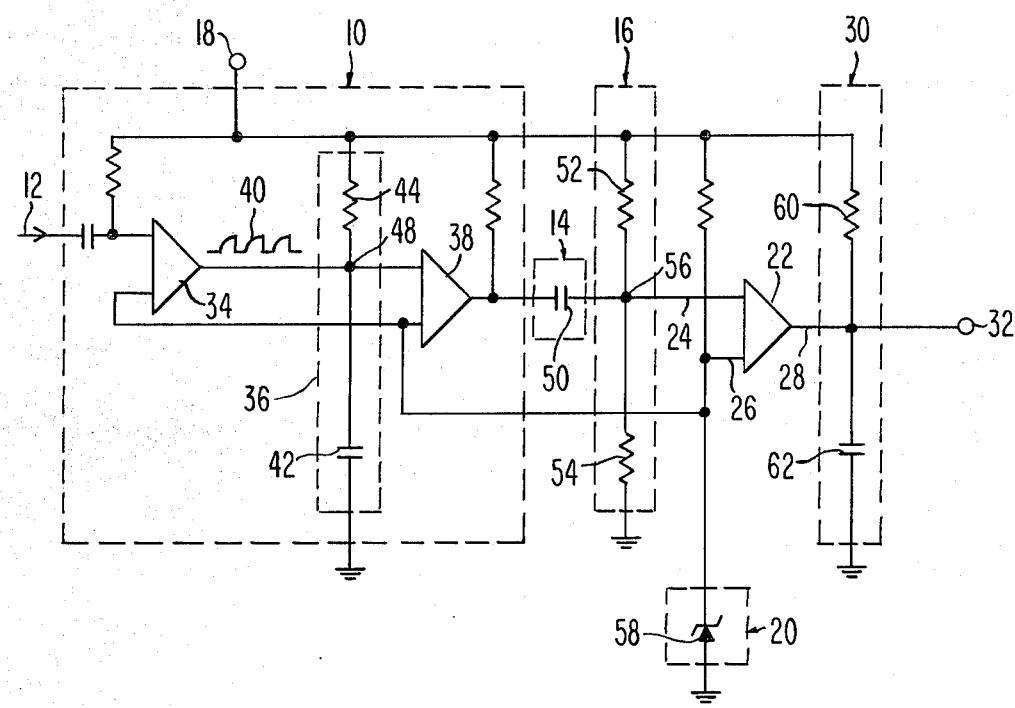
FIG. 2 is a circuit diagram of the preferred embodiment.

The circuit diagram for the preferred embodiment of the universal reset circuit is shown in FIG. 2. This circuit is designed so that it can be fabricated on a single integrated circuit chip. The pulse timing circuit 10 is essentially composed of a first comparator 34, an RC timing circuit 36, and a second comparator 38. The first comparator 34 compares the clock pulse train 12 with the constant voltage source 20 and produces a low output with each clock pulse and a high output between clock pulses. The waveform 40, produced by comparator 34 when it receives a regular clock pulse train, is shown in FIG. 2. An RC timing circuit 36 is connected to the output of the first comparator 34 and keeps its voltage at point 48, below the reference voltage level when a regular clock pulse is inputted, but allows the capacitor 42 to charge and raise the voltage 48 above the reference voltage level when a clock pulse does not appear at comparator 34 within a set time interval. For correct timing, capacitor 42 and resistor 44 should be a value such that their product is larger than the pulse width of the clock pulse. A second comparator 38 compares the voltage at point 48 in the circuit with a reference voltage 20 and produces a low voltage output pulse when the voltage at 48 raises above the reference voltage 20. The pulse shaping circuit 14 connects to the output of comparator 38 and contains a single capacitor 50. The value of capacitor 50 determines the pulse width of the reset pulse.

The divider circuit 16 described in FIG. 1, is shown in FIG. 2 to be of typical design having two resistors 52, 54 with values so that the voltage at point 56 is less than the reference voltage 20 when a low DC voltage condition is experienced. The constant voltage source 20 is a 1% Zener diode 58, or equivalent, which is biased to produce a fairly stable 3.3 v reference voltage.

As described previously, the comparator 22 compares the voltage at input 24 with the reference voltage 20 at input 26 and produces a low voltage output when the voltage at 24 drops below the reference voltage 20. The voltage at 24 is a sum of the divider voltage at 56 and the output from comparator 38 as modified by capacitor 50. When the divider voltage at 56 drops below the reference voltage, the output of the comparator 28 will swing low. When the DC voltage 18 returns to an adequate level the output of the comparator 28 will swing high. A missing clock pulse 12 is detected by the pulse timing circuit and will result in a negative pulse being sent to input 24. This in turn will produce a negative pulse at the output of comparator 28.

The power reset delay circuit 30, which connects to the output of comparator 22, holds the resultant output 32 low for a set period of time after the DC voltage level has returned to a normal value. The power reset delay circuit 30 is an RC circuit containing resistor 60 and capacitor 62, the values of which are adjusted for the desired reset delay.

In operation, an adequate DC voltage 18 will produce a high output signal 32. If a missing clock pulse 12 is detected, a negative pulse will be produced at the output 32. If the DC voltage 18 drops below a set value, output 32 will drop low. When the DC voltage level 18 again attains an adequate level, output 32 may be connected to a reset pin commonly found on microprocessor chips and to an input controller for any computer system and will re-initialize the system when a power interrupt is experienced.

One advantage of this novel circuit is that it combines DC low voltage detection and clock pulse failure detection in the same circuit, thereby reducing the amount of components and the manufacturing costs. The circuit is designed so that it can be fabricated on a single integrated circuit chip.

Another advantage of this circuit is that it provides a reset command for both a short and long term power interrupt. A long term power interrupt, or brownout, will be detected by a decrease in the DC voltage. A short term power interrupt will be detected by a missed clock pulse. To adequately provide system reset, both low DC voltage and missing clock pulses are detected and used to generate a single reset command which is compatible with common microprocessor chips and with input control systems in computers.

Another advantage of this circuit is that it incorporates a simplified pulse timing circuit for detecting a missing clock pulse containing two comparators and an RC network.

Obviously, any modifications and variations of the present invention are possible in light of the above teachings. It is therefore to be understood that within the scope of the amended claims the invention may be practiced otherwise than as specifically described.

What is claimed and desired to be secured by Letters Patent of the United States is:

1. A universal reset circuit for digital circuitry which monitors clock pulses and DC voltage and provides a reset command when detecting a low DC voltage or a missing clock pulse comprising:

a constant voltage means for providing a stable reference voltage;

a pulse timing means receiving said clock pulses for providing an output voltage level above said reference voltage when a regular clock pulse is received and allowing its output voltage to fall below said reference voltage when a clock pulse does not appear within a set time interval generating a low output pulse;

a divider means connected across the DC voltage for producing a test voltage which is less than said reference voltage when a low DC voltage condition is experienced;

a comparator which compares a combined input from said bridge means and said pulse timing means with said constant voltage means such that said comparator output will be high unless a missing clock pulse is detected which will produce a negative reset pulse or, unless a low DC voltage is detected which will produce a low output from said comparator.

2. The apparatus of claim 1, also comprising, a power reset delay means connected to the output of said comparator for holding the output of said comparator low for a set period of time after the DC voltage level has returned to normal.

3. The apparatus of claim 2, also comprising, a pulse shaping means connected between said pulse timing means and said comparator for setting the pulse width of the negative reset pulse produced at the output of said comparator.

4. The apparatus of claims 1 or 2 in which said pulse timing means comprises:

a first comparator compares the clock pulses with said constant voltage source, producing a low output with each clock pulse and a high output between clock pulses;

a timing circuit containing a capacitor and resistor is connected to the output of said first comparator and keeps its output voltage below said reference level when a regular clock pulse train is inputed to said first comparator but allows its output voltage to raise above said reference voltage when a clock pulse did not appear within a set time interval;

a second comparator receives input from said timing circuit and said constant voltage source and produces a low output pulse when said timer circuit's output voltage raises above said reference voltage.

5. The apparatus of claim 4 in which said resistor and capacitor in said timing circuit are of a value such that their product is greater than the clock pulse width.

6. The apparatus of claim 3 in which said pulse shaping means is a capacitor, the value of said capacitor determining the pulse width.

7. The apparatus of claim 3 in which said power reset delay means is an RC circuit containing a resistor and capacitor, the values of said resistors and capacitors can be varied to increase or decrease the time delay.

8. The apparatus of claims 1 or 3 in which said constant voltage means is a diode.

9. The apparatus of claims 1 or 3 in which said constant voltage is a 1% Zener diode.

10. A universal reset circuit for digital circuitry which monitors clock pulses and DC voltage and produces a reset command when detecting a low DC voltage or a missing clock pulse, comprising:

a 1% Zener diode, which produces a stable reference voltage;

a first comparator which compares the clock pulses with said reference voltage producing a low voltage output with each clock pulse and a high output between clock pulses;

a timing circuit containing a first capacitor and a first resistor is connected to the output of said first comparator to keep its output voltage below said reference voltage when a regular clock pulse train is inputed to said first comparator, but allows its output voltage to raise above said reference voltage when a clock pulse did not appear within a set time interval;

a second comparator receives inputs from said timing circuit and said 1% Zener diode and produces a low voltage output pulse when the output voltage from said timer circuit raises above said reference voltage;

a second capacitor connected to the output of said second comparator used to shape the low voltage output pulse produced by the second comparator;

a divider connected across the DC voltage to provide a test voltage which is less than said reference voltage when a low DC voltage condition is experienced;

a third comparator which compares a combined input from said divider and said second capacitor with said reference voltage, such that the output of said comparator will be high unless a missing clock pulse is detected, which will produce a negative reset pulse, or unless a low DC voltage is detected which will produce a low output from said comparator; and, an RC circuit connected to the output of said third comparator for holding the output of said comparator low for a set period of time after the DC voltage level has returned to normal.

* * * * *